United States Patent [19]

Usami et al.

[11] Patent Number: 4,597,159
[45] Date of Patent: Jul. 1, 1986

[54] METHOD OF MANUFACTURING SIO₂-SI INTERFACE FOR FLOATING GATE SEMICONDUCTOR DEVICE

[75] Inventors: Toshiro Usami; Yuuichi Mikata; Kazuyoshi Shinada, all of Yokohama, Japan

[73] Assignee: Kabushiki Kaisha Toshiba, Japan

[21] Appl. No.: 706,096

[22] Filed: Feb. 27, 1985

[30] Foreign Application Priority Data

Mar. 9, 1984 [JP] Japan .................................. 59-45216

[51] Int. Cl.⁴ ...................... H01L 21/02; H01L 21/34; H01L 21/76; H01L 21/94
[52] U.S. Cl. ..................................... 29/571; 29/576 T; 148/DIG. 53; 148/DIG. 138; 148/DIG. 169; 357/23.8; 204/192 D; 427/99
[58] Field of Search ................... 29/571, 576 B, 576 J, 29/576 T; 148/DIG. 53, DIG. 138, DIG. 169; 357/23.5, 23.8; 204/192 D; 427/99

[56] References Cited

PUBLICATIONS

Wada et al., "Grain Growth Mechanism of Heavily Phosphorus-Implanted Polycrystalline Silicon," Journal of Electrochemical Society, vol. 125 No. 9, pp. 1499-1504, 1978.

Faraone, "An Improved Fabrication Process for Multi-Level Polysilicon Structures," Journal of Electrochemical Society, IEEE Electron Devices Society, 1983 Symposium on VLSI Technology, Digest of Technical Papers, pp. 110-111, Sep. 12-15, 1983.

Anderson et al, "Evidence for Surface Asperity Mechanism of Conductivity in Oxide Grown on Polycrystalline Silicon", *J. of Appl. Phys.*, 48(11), 11/77, pp. 4834-4836.

Huff, "Experimental Observations on Conductance Through Polysilicon Oxide", *J. Electrochem. Soc.*, 127(11), pp. 3482-3488.

*Primary Examiner*—Brian E. Hearn
*Assistant Examiner*—J. Callahan
*Attorney, Agent, or Firm*—Finnegan, Henderson, Farabow, Garrett & Dunner

[57] ABSTRACT

A semiconductor device is manufactured by forming a first insulating film on a surface of a semiconductor substrate of a first conductivity type, and a first nonmonocrystalline silicon film is formed on the first insulating film. A second insulating film is deposited on the first nonmonocrystalline silicon film by CVD, sputtering or molecular beam method. An impurity is then ion-implanted in the first nonmonocrystalline silicon film through the second insulating film. The second insulating film is then removed to expose the surface of the first nonmonocrystalline silicon film doped with the impurity, and a thermal oxide film is formed on the exposed portion of the first nonmonocrystalline silicon film. Subsequently, a second nonmonocrystalline silicon film is formed on the thermal oxide film, and a third insulating film is formed on the second nonmonocrystalline silicon film.

6 Claims, 12 Drawing Figures

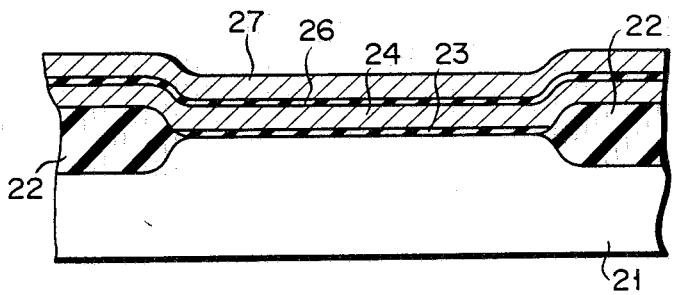
F I G. 3F
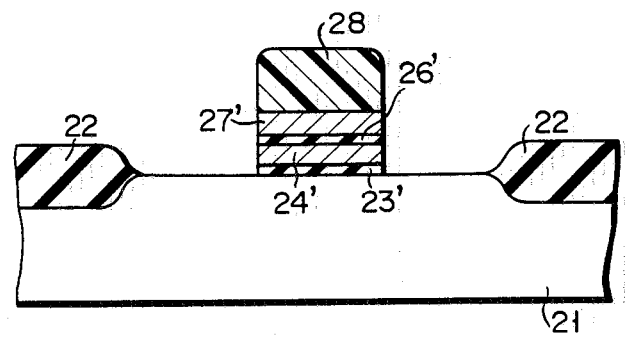
F I G. 3G
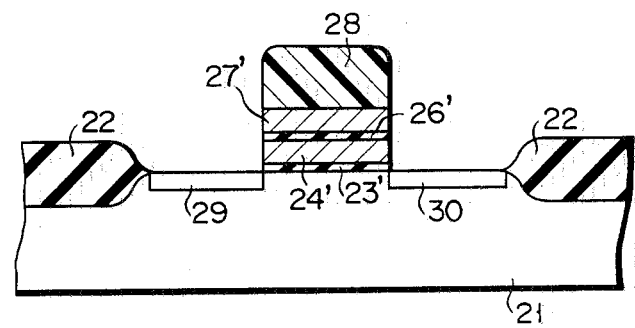
F I G. 3H
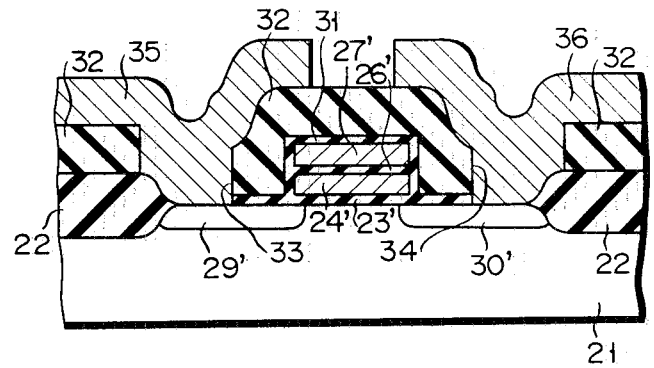
F I G. 3I

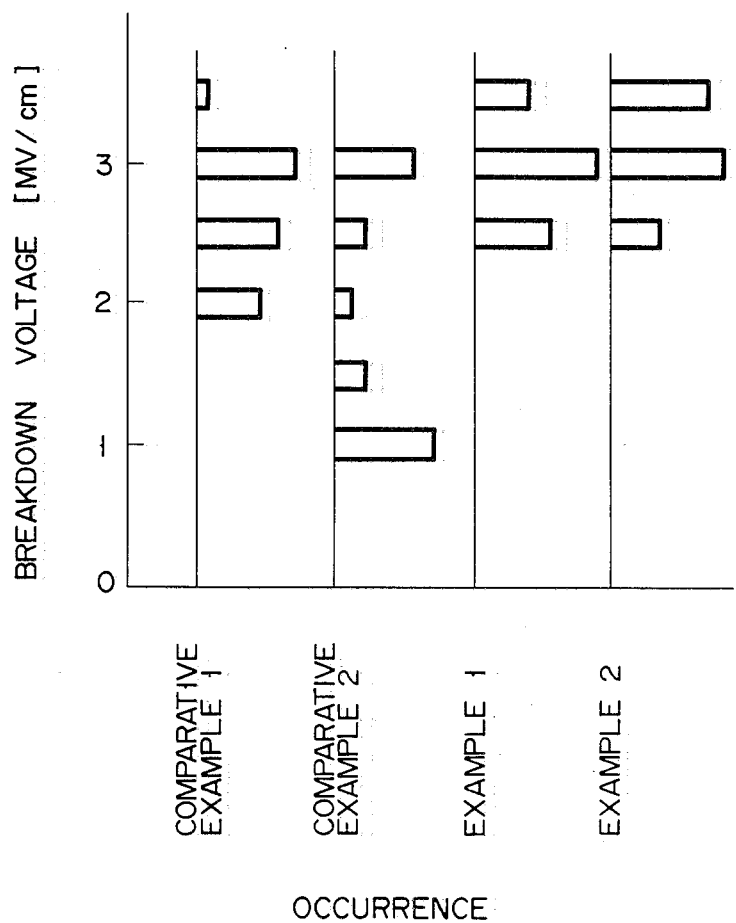

METHOD OF MANUFACTURING SIO₂-SI INTERFACE FOR FLOATING GATE SEMICONDUCTOR DEVICE

BACKGROUND OF THE INVENTION

1. Field of the Invention

The present invention relates to a method of manufacturing a semiconductor device and, more particularly, to a method of manufacturing a nonvolatile memory device wherein an insulating film having improved breakdown voltage and leakage current characteristics is formed on a thin silicon film.

2. Description of the Prior Art

Most of the conventional programable nonvolatile memory devices such as an erasable programable read only memory (EPROM) and an electrically erasable programable read only memory ($E^2$PROM) have a nonmonocrystalline silicon floating gate. For example, as shown in FIG. 1, an EPROM cell has an element region in a p-type silicon substrate 1. This element region is isolated by a field oxide film 2. $N^+$-type source and drain regions 7 and 8 are formed spaced apart from each other in the element region. A first gate oxide film 3, a nonmonocrystalline silicon (polycrystalline silicon or amorphous silicon) floating gate 4, a second gate oxide film 5 and a control gate 6 are sequentially formed on the surface of the element region between the source and drain regions 7 and 8. An oxide film 9 is formed on exposed surface portions of the floating gate 4 and the control gate 6.

A high voltage is applied to the control gate 6 and the drain region 8 to inject carriers (hot electrons) from the channel region to the floating gate 4. A threshold voltage of the transistor changes by carriers stored in the floating gate 4, thereby performing a memory operation. Since the memory content is expressed in accordance with the presence/absence of the carriers stored in the floating gate, the gate oxide films 3 and 5 formed on and below the floating gate 4 must have good breakdown voltage and leakage current characteristics.

In general, the first gate oxide film 3 is formed by thermally oxidizing a surface layer of the silicon substrate, and the second gate film 5 is formed by thermally oxidizing a surface layer of nonmonocrystalline silicon of the floating gate 4. When an element is micropatterned, a local electric field in the element is increased. In particular, decreases in breakdown voltage and leakage current of the second gate oxide film 5 become a problem.

The breakdown voltage and leakage current characteristics of the second gate oxide film 5 greatly depend on the shape (i.e., roughening) of an interface between the nonmonocrystalline silicon film of the floating gate 4 and the oxide film (second gate oxide film). The interface shape must be as flat as possible. The factors which influence the interface shape are crystallographic properties (polycrystalline or amorphous silicon, or grain size if polycrystalline silicon) before oxidation, the type of impurity in nonmonocrystalline silicon, its concentration, and oxidation conditions (temperature, oxidation atmosphere and time). An in-depth explanation of these factors is given by G. Harbeke et al., RCA Review, Vol. 44, June (1983) 287 and D. A. Smith et al., Material Research Society Symposium Proceeding, Vol. 5, P. 65 (1982).

In order to flatten the interface shape in the practical device fabrication process, the nonmonocrystalline silicon film is doped with phosphorus, and the phosphorus-doped silicon film is then subjected to thermal oxidation. There are three conventional methods of introducing phosphorus in the nonmonocrystalline silicon film:

(i) Nonmonocrystalline silicon is doped with phosphorus from a vapor phase while it is grown from the vapor phase.

(ii) Phosphorus is deposited on a nonmonocrystalline silicon film by using POCl₃ or the like as a diffusion source after the nonmonocrystalline silicon film is deposited, and diffused in the silicon film by annealing.

(iii) Phosphorus is ion-implanted in a nonmonocrystalline silicon film after this film is deposited, and annealing is performed to activate the implanted phosphorus.

With methods (i) and (ii), a phosphorus concentration is controlled in the vapor phase, resulting in degradation of uniformity, reproducibility and controllability of the phosphorus concentration in the nonmonocrystalline silicon film. Therefore, the controllability of the interface shape and the breakdown voltage characteristic of the gate oxide film is also degraded. On the contrary, with method (iii), uniformity of the phosphorus concentration in the nonmonocrystalline silicon film is excellent. However, in practice, method (i) or (ii) is used. This is because variations in breakdown voltage of the oxide film (second gate oxide film) occur when phosphorus is ion-implanted in the nonmonocrystalline silcon film which is thermally oxidized. According to the present inventors, phosphorus was introduced in a nonmonocrystalline silicon film by methods (i), (ii) and (iii), and the film was thermally oxidized to obtain the second gate oxide films. The relationship between the phosphorus concentration and the breakdown voltage of the second gate oxide film obtained through each of methods (i), (ii) and (iii) is illustrated in FIG. 2. As is apparent from FIG. 2, the breakdown voltage of the gate oxide film prepared through method (iii) is lower than that obtained through methods (i) and (ii) at the same concentration of phosphorus and tend to vary, though the controllability of the phosphorus concentration is good. As shown in FIG. 2, it is also readily understood that the phosphorus concentration in nonmonocrystalline silicon greatly influences the breakdown voltage and leakage current characteristics of the second gate oxide film. In methods (i) and (ii), the phosphorus concentration cannot be controlled exactly, and the breakdown becomes difficult to control.

SUMMARY OF THE INVENTION

It is, therefore, an object of the present invention to provide a method of forming a gate oxide film having good breakdown voltage and leakage current characteristics on a nonmonocrystalline silicon gate by utilizing thermal oxidation.

It is another object of the present invention to provide a method of manufacturing a nonvolatile memory device having a floating gate, the floating gate being provided with an oxide film having good breakdown voltage and leakage current characteristics.

According to the present invention, a first insulating film is formed on a surface of a semiconductor substrate of a first conductivity type, and a first nonmonocrystalline silicon film is formed on the first insulating film.

A second insulating film is deposited on the first nonmonocrystalline silicon film under a condition that the first nonmonocrystalline silicon film is not oxidized but that an insulating film can be deposited on the first nonmonocrystalline silicon film.

Thereafter, an impurity is ion-implanted in the first nonmonocrystalline silicon film through the second insulating film.

After ion implantation, the second insulating film is removed to expose the surface of the first nonmonocrystalline silicon film which has been doped with the impurity, and an oxide film is thermally formed on the exposed portion of the first nonmonocrystalline silicon film.

Subsequently, a second nonmonocrystalline silicon film is formed on the thermal oxide film, and finally a third insulating film is formed on the second nonmonocrystalline silicon film.

BRIEF DESCRIPTION OF THE DRAWINGS

FIGS. 3A to 3I are respectively sectional views for explaining the steps in manufacturing a semiconductor device according to a method of the present invention; and FIG. 4 is a graph showing a histogram of the breakdown voltage of the gate oxide film formed on the floating gate according to the method of the present invention and a histogram of the breakdown voltage of the gate oxide film formed on the floating gate according to the conventional method.

DETAILED DESCRIPTION OF THE PREFERRED EMBODIMENT

The present inventors have made extensive studies on the conventional methods, in particular method (iii), so as to utilize its advantage (uniform impurity concentration by ion implantation) and eliminate its disadvantage. The present inventors found that a contaminating material present on the nonmonocrystalline silicon film of the floating gate is introduced therein during ion-implanation of an impurity into the floating gate and roughens the interface between the nonmonocrystalline silicon film and the oxide film at the thermal oxidation. Upon this assumption, a further consideration was made. The present inventors found that the prescribed object can be achieved by covering the nonmonocrystalline silicon film with an insulating film when an impurity is ion-implanted in the nonmonocrystalline silicon film. This insulating film must be deposited under a condition in which the nonmonocrystalline silicon film is not oxidized.

The present invention will be described in detail where a method thereof is applied to the fabrication of an EPROM.

Figure 1:
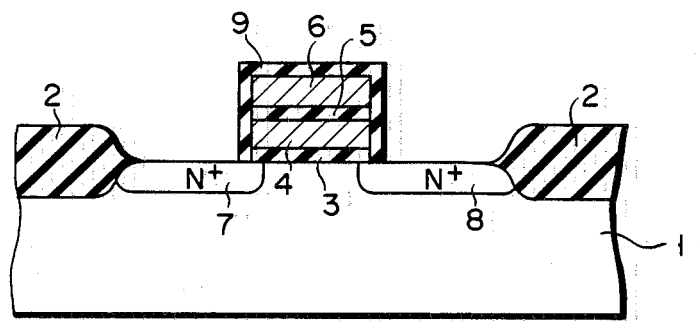
FIG. 1 is a sectional view for explaining a method of manufacturing a conventional EPROM.
Figure 2:
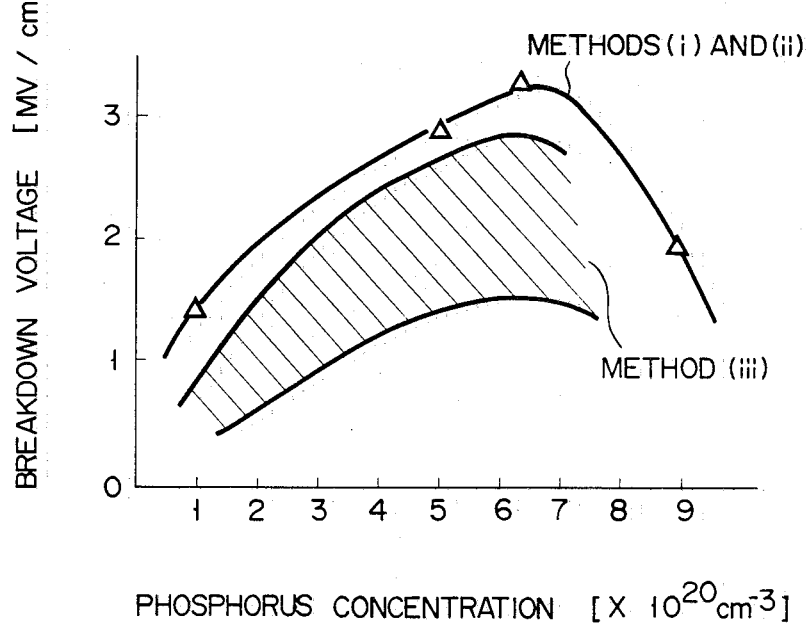
FIG. 2 is a graph for explaining the relationship between the average breakdown voltage of the gate oxide film formed on the floating gate by conventional methods and the phosphorus concentration of the floating gate.
Figure 3A:
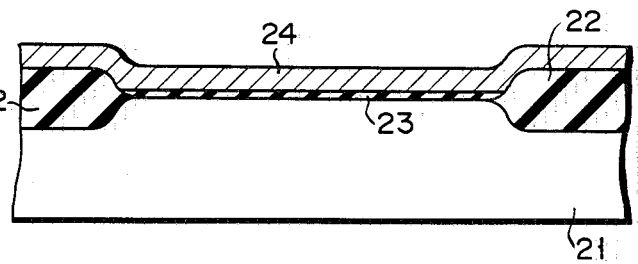

As shown in FIG. 3A, a field oxide film 22 is formed on a surface layer of a $p^-$-type semiconductor substrate (e.g., a silicon substrate 21) by selective oxidation. The resultant structure is heated in an oxygen atmosphere at a temperature of 1,000° C. to form a first insulating film (oxide film) 23 on the surface of the element formation region surrounded by the field oxide film 22. The first insulating film has a thickness of, for example, 500 Å to 800 Å. A first polycrystalline silicon film 24 is deposited so as to cover the entire surface (surfaces of the field oxide film 22 and the oxide film 23). The undoped polycrystalline silicon film 24 is formed by a conventional reduced pressure CVD (chemical vapor deposition) method. The polycrystalline silicon film 24 has a thickness of, for example, 4000 Å.

Figure 3B:
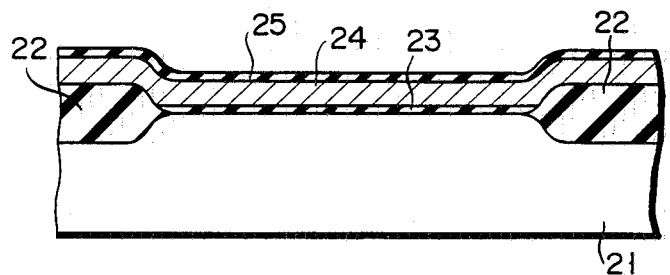

As shown in FIG. 3B, a second insulating film such as a silicon oxide film 25 is deposited on the first polycrystalline silicon film 24. This insulating film 25 is deposited under a condition in which the polycrystalline silicon film 24 is not oxidized. If the polycrystalline silicon is oxidized, the interface between the film 24 and the oxide film formed by this oxidation becomes uneven or is roughened. In order to prevent this, the atmosphere in which the film 24 is formed does not contain sufficient oxygen for oxidization of the film 24 to take place. Therefore, thermal oxidation must not be performed. More particularly, the insulating film 25 is formed by CVD, sputtering or a molecular beam method. These methods are known to those skilled in the art. The CVD method is conveniently performed at 400° C. in a gas atmosphere of monosilane and oxygen. The sputtering method is preferably performed at 100° C. and a pressure of $10^{-3}$ to $10^{-5}$ Torr. The molecular beam method is performed by heating a target at a high vacuum pressure of $10^{-8}$ to $10^{-10}$ Torr and a temperature not lower than the melting point of silicon.

The resultant interface between the insulating film 25 and the polycrystalline silicon film 24 becomes uniform and flat. In other words, the surface of the polycrystalline silicon film 24 is kept flat.

Figure 3C:
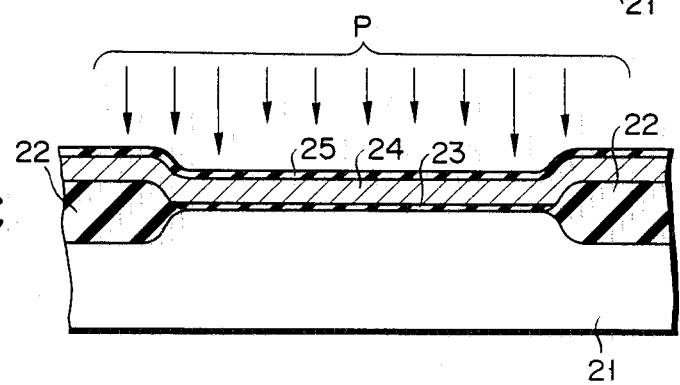

As shown in FIG. 3C, phosphorus P is ion-implanted in the polycrystalline silicon film 24 through the insulating film 25. The concentration of the phosphorus in the polycrystalline silicon film 24 generally falls within the range of $5 \times 10^{20}$ and $7 \times 10^{20}$ atoms/cm$^3$. After phosphorus is ion-implanted in the polycrystalline silicon, the resultant structure is annealed in an inert gas, e.g., nitrogen gas at a temperature of 950° C. for 30 minutes in order to activate the doped phosphorus and to eliminate the damage in the polycrystalline silicon film. Thereafter, as shown in FIG. 3D, the insulating film 25 is removed to expose the surface of the polycrystalline silicon film 24.

Figure 3D:
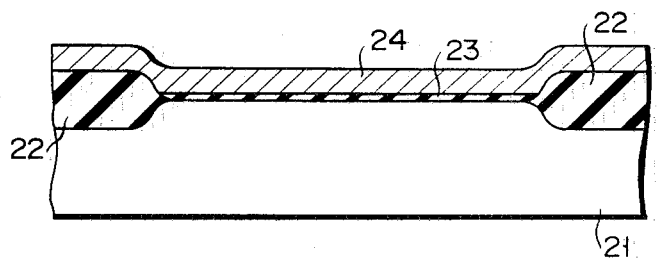
Figure 3E:
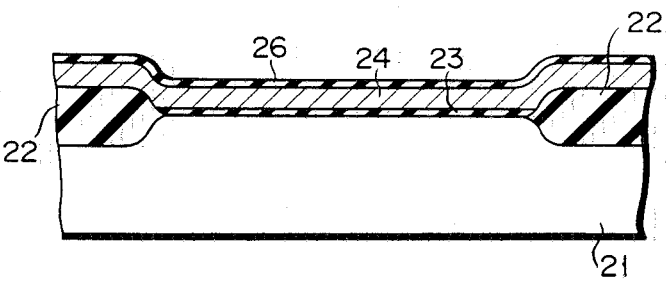

The structure shown in FIG. 3D is heated in an oxidizing gas atmosphere (e.g., oxygen gas atmosphere diluted with argon gas) at a temperature of 950° C. to 1000° C. to form an oxide (of the silicon forming the film 24) film 26 on the surface of the first polycrystalline silicon film 24 (FIG. 3E). The oxide film 26 has a thickness of, for example, 500 Å to 800 Å.

As shown in FIG. 3F, a second polycrystalline silicon film 27 is formed on the oxide film 26 in the same manner as described above. Then, the silicon film 27 is doped with phosphorus by using phosphoryl trichloride (POCl$_3$) as a diffusion source, for example. A phosphorus concentration of the second polycrystalline silicon film 27 falls within the range between $4 \times 10^{20}$ atoms/cm$^3$ to $6 \times 10^{20}$ atoms/cm$^3$.

By using a photoresist pattern 28 as a mask, the second polycrystalline silicon film 27, the oxide film 26, the first polycrystalline silicon film 24 and the oxide film 23 are sequentially patterned by reactive ion etching, thereby exposing surfaces of predetermined portions of the element formation region of the substrate 21. In this manner, a first gate oxide film made of the remaining oxide film 23', a floating gate made of the remaining first polycrystalline silicon film 24', a second gate oxide film made of the remaining oxide film 26', and a control gate made of the remaining second polycrystalline silicon film 27' are formed (FIG. 3G).

Thereafter, an impurity such as arsenic is ion-implanted in the substrate 21 to form n-type impurity regions 29 and 30 (FIG. 3H) by using a photoresist pattern 28 as a mask.

After the photoresist pattern 28 is removed, the structure shown in FIG. 3H is heated in a dry oxygen atmosphere at a temperature of 950° C. to 1000° C. to oxidize the exposed surface portions of the control gate 27', the floating gate 24' and the substrate 21. The thickness of the resultant oxide film 31 is 500 Å to 800 Å. By this heating, the ion-implanted impurity is activated, the damage in the substrate is removed, and n+-type source and drain regions 29' and 30' are formed. Subsequently, a CVD oxide film 32 having a thickness of, for example, 0.5 μm is formed to cover the entire surface, and contact holes 33 and 34 which partially expose the source and drain regions 29' and 30' are formed. Finally, a metallic wiring material such as an aluminum-silicon alloy is formed to cover the entire surface and is patterned to form source and drain electrodes 35 and 36 which are respectively electrically connected to the source and drain regions 29' and 30' through the contact holes 33 and 34. As a result, an EPROM cell shown in FIG. 3I is prepared.

EXAMPLE 1

An EPROM cell was formed in a p-type (100) silicon substrate in accordance with the steps shown in FIGS. 3A to 3I. However, the second oxide film was formed by a reduced pressure CVD method. The detailed fabrication conditions are shown in the following table.

TABLE

| | Thickness | Forming conditions, etc. |
|---|---|---|
| First gate oxide film | 500 Å | Substrate silicon oxidation in oxygen atmosphere at 1,000° C. |
| First polycrystalline silicon film 24 | 4,000 Å | CVD method in monosilane gas atmosphere at 630° C. and 50 Torr |
| Insulating film 25 | 500 Å | CVD method in gas atmosphere of monosilane and oxygen at 400° C. and 760 Torr |
| Ion-implantation into first polycrystalline silicon film | — | Phosphorus ion-implantation; acceleration energy: 80 keV; dose: $1.6 \times 10^{16}$ cm$^{-2}$ |
| Second gate oxide film | 500 Å | Thermal oxidation in oxygen gas atmosphere diluted with argon at 1000° C. |
| Second polycrystalline silicon film | 3,000 Å | Same as in the case of the first polycrystalline silicon film |
| Source and drain | — | Arsenic ion-implantation; acceleration energy: 40 keV; dose: $3 \times 10^{15}$ cm$^{-2}$; sheet resistance: 50 Ω/□; junction depth: 0.2 μm |
| Oxide film 32 | 400 Å | Heating in dry oxygen atmosphere at 950° C. |
| Source and drain electrodes | 1.0 μm | Al—Si vapor deposition |

EXAMPLE 2

An EPROM was prepared in the same manner as in Example 1, except that the oxide film 25 was formed by sputtering at a temperature of 750° C. The oxide film had a thickness of 300 Å.

COMPARATIVE EXAMPLE 1

In Example 1, after the first polycrystalline silicon film was formed, phosphorus was deposited on the first polycrystalline silicon film by using phosphoryl tetrachloride as a diffusion source, and thereafter the resultant structure was annealed at a temperature of 950° C. for 40 minutes to diffuse the phosphorus into the first polycrystalline silicon film. The other steps in Comparative Example 1 were substantially the same as that of Example 1, thus preparing an EPROM cell.

COMPARATIVE EXAMPLE 2

An EPROM cell was prepared in the same manner as in Example 1, except that phosphorus was directly ion-implanted in the first polycrystalline silicon film without forming the insulating film 25 after the first polycrystalline silicon film was deposited.

The histograms of breakdown voltages of the respective second gate oxide films of the EPROMs are illustrated in FIG. 4.

As is apparent from FIG. 4, the breakdown voltage characteristics of the EPROM cells of Examples 1 and 2 are greatly improved as compared with those of the EPROM cells of Comparative Examples 1 and 2. It is also found that when the method of the present invention is used, the leakage current characteristic can be improved at the same time as the breakdown voltage characteristic.

In the above embodiment, phosphorus is ion-implanted in polycrystalline silicon. However, even if any other impurity ion is used, the same effect as in the above embodiment can be expected. For example, the same effect is obtained even if arsenic is used. Polycrystalline silicon is used as a material of the floating gate. However, the material of the floating gate is not limited to polycrystalline silicon but can be extended to amorphous silicon.

The present invention is applied to the EPROM, but can be applied to the manufacture of any other semiconductor device such as an E$^2$PROM.

According to the method of manufacturing a semiconductor device of the present invention, the breakdown voltage and leakage current characteristics of the oxide film between the floating gate and the control gate in an EPROM, an E$^2$PROM or the like can be improved, thereby improving its performance.

What is claimed is:

1. A method of manufacturing a semiconductor device, comprising the steps of:
   (a) forming a first insulating film on a surface of a semiconductor substrate of a first conductivity type;
   (b) forming a first nonmonocrystalline silicon film on said first insulating film;

(c) depositing a second insulating film on said first nonmonocrystalline silicon film under a condition that said first nonmonocrystalline silicon film is not oxidized but that an insulating film can be deposited on said first nonmonocrystalline silicon film;

(d) ion-implanting an impurity in said first nonmonocrystalline silicon film through said second insulating film;

(e) removing said second insulating film to expose said first nonmonocrystalline silicon film doped with the impurity;

(f) forming, by thermal oxidation, an oxide film on an exposed portion of said first nonmonocrystalline silicon film;

(g) forming a second nonmonocrystalline silicon film on said oxide film; and (h) forming a third insulating film on said second nonmonocrystalline silicon film.

2. A method according to claim 1, wherein said second insulating film is formed by chemical vapor deposition.

3. A method according to claim 1, wherein said second insulating film is formed by sputtering.

4. A method according to claim 1, wherein said second insulating film is formed by a molecular beam method.

5. A method according to claim 1, wherein said impurity is phosphorus or arsenic.

6. A method according to claim 1, further including the step of sequentially removing parts of said third insulating film, said second nonmonocrystalline silicon film, said oxide film, said first nonmonocrystalline silicon film and said first insulating film to partially expose the surface of said semiconductor substrate, and doping said semiconductor substrate with an impurity having a second conductivity type opposite to the first conductivity type through said exposed surfaces of said semiconductor substrate to form semiconductor regions in said semiconductor substrate.

* * * * *